United States Patent [19]
Smalén

[11] Patent Number: 5,379,768
[45] Date of Patent: Jan. 10, 1995

[54] ANATOMIC SUPPORT FOR AN MRI-APPARATUS

[75] Inventor: Matti Smalén, Klaukkala, Finland

[73] Assignee: Picker Nordstar, Inc., Finland

[21] Appl. No.: 975,633

[22] Filed: Nov. 13, 1992

[30] Foreign Application Priority Data

Nov. 15, 1991 [FI] Finland .................... 915394

[51] Int. Cl.⁶ ............................... A61B 5/055
[52] U.S. Cl. ...................... 128/653.5; 324/318; 324/321; 378/208
[58] Field of Search ............ 128/653.5; 324/318, 324/309, 321; 378/208

[56] References Cited

U.S. PATENT DOCUMENTS

| | | | |
|---|---|---|---|
| 4,617,936 | 10/1986 | Malko | 128/653.5 |
| 4,634,980 | 1/1987 | Misic et al. | 324/318 |
| 4,774,468 | 9/1988 | Bydder | 128/653.5 |
| 5,030,915 | 7/1991 | Boskamp et al. | |
| 5,050,605 | 9/1991 | Eydelman et al. | 128/653.5 |
| 5,085,219 | 2/1992 | Ortendahl et al. | 128/653.5 |
| 5,143,068 | 9/1992 | Muennemann et al. | 128/653.5 |
| 5,221,902 | 6/1993 | Jones et al. | 128/653.5 |

FOREIGN PATENT DOCUMENTS

| | | |
|---|---|---|
| 430103 | 6/1991 | European Pat. Off. |
| 3819541 | 12/1988 | Germany |
| 8910722 | 11/1989 | WIPO |

*Primary Examiner*—Kyle L. Howell
*Assistant Examiner*—Brian L. Casler
*Attorney, Agent, or Firm*—Andrus, Sceales, Starke & Sawall

[57] ABSTRACT

The invention relates to a supporting cushion intended for aligning or positioning the RF-coils of a magnetic resonance imaging apparatus and a patient, which cushion can serve as a part of the RF-coil and which is capable of providing a support for the RF-coil and the patient in accordance with the anatomy of an individual patient. Air is pumped in the cushion for giving the supporting cushion a desired thickness. The cushion is placed against the RF-coil in a manner that, by pumping air therein, said cushion presses the soft and yielding RF-coil against the patient. The cushion can be used e.g. in back and neck coils. The cushion can also be fitted between a patient's supporting rest and a patient in a manner that a section of the patient to be imaged is immobilized for the duration of imaging. For example, the head can be supported or braced this way by fitting the cushion between the head and a head rest.

7 Claims, 3 Drawing Sheets

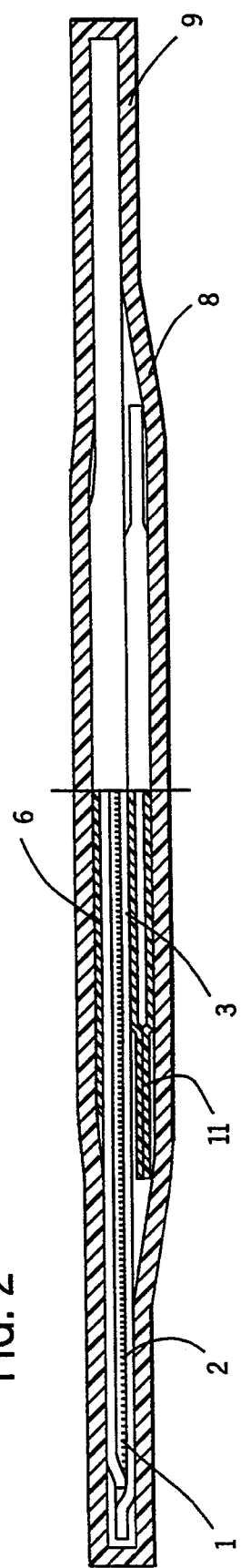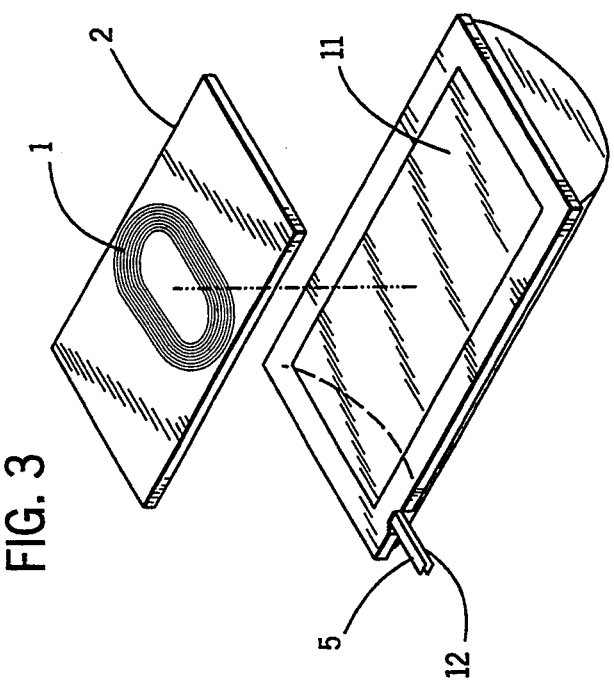
FIG. 2
FIG. 3

ANATOMIC SUPPORT FOR AN MRI-APPARATUS

BACKGROUND OF THE INVENTION

An object of the present invention is to improve the positioning between a patient and an RF-imaging coil in magnetic resonance imaging apparatus by means of a supporting aid for the coil and the patient. The coils and supporting equipment can be used for producing images of a patient by means of a magnetic resonance imaging apparatus over the head, neck, back and limb portions of a patient.

An object of the invention is to provide an elastic and soft cushion, yielding to the anatomy of a patient and, if necessary, serving as a part of the RF-imaging coil.

The RF-imaging coils of a magnetic resonance imaging apparatus are used both as transmitters and receivers for an RF-signal. In view of maximizing the signal-to-noise ratio, the RF-receiving coils must be designed in their winding dimensions as small as possible, yet in a manner that the picture area achieved thereby covers a desired anatomical object. Therefore, a separate RF-receiving coil is most preferably constructed for each object to be imaged. Typically, these include e.g. head, neck, back, body and knee imaging coils. In order to avoid movement-related artifacts the patient must also remain stationary during an imaging session, which is generally appr. 15 minutes in duration.

An RF-frequency excitation pulse required in imaging is produced by means of an RF-transmitting coil which, in view of achieving a good transmission field homogeneity, is usually a separate coil larger in dimensions than RF-receiving coils. Sometimes both the receiving and transmitting coil can be combined as a single RF-coil.

The direction of an applied DC-magnetic field has a major effect on the winding geometry of coil designs.

In terms of their mechanical construction, the prior known RF-receiving coils are generally hard objects which do not allow for a shape conforming to the anatomy of a particular patient. In the case of such a coil, it is possible to imitate the anatomical shape but, due to the individual variation in anatomy, the coil winding generally tends to stay far away from the object resulting in a poorer picture quality.

It is generally known that the coils of a hard mechanical structure always require some soft object separate from or fastened to the coil to serve as a cushion between patient and coil. If the piece of cushion is not anatomically shaped or designed, it does not necessarily provide a sufficient support for a patient. The cushioning piece can be designed to comply with anatomy, but it is impossible to cover all variations with a single design. Thus, the cushioning pieces may be available in various shapes and sizes, whereby the right one must be found by fitting to the patient. This may prove difficult with barely movable patients. In addition, the fitting efforts may take too much of valuable examination time.

It is known that the use of soft coils adds to the comfort of a patient. If the coil is also flexible, it will also be capable of adjusting to anatomical variations. However, without a support which is sufficient and arranged in view of the individual anatomical shape of a patient it is not possible to sufficiently exploit all the benefits offered by a soft coil.

It is known that the back coils are generally hard or padded flat objects, which are placed under the back and upon which a patient is laid on his/her back. This type of flat structure does not take into consideration the anatomical variation resulting from curvature of the spine. This problem is encountered especially in those coils that are long in the longitudinal direction of the spine, e.g. coils with an elliptical winding or coils consisting of several successive winding elements. What may happen in this situation is that the coil with a good signal-to-noise ratio shall remain too far away from the spine resulting in a poorer picture quality.

In the neck and throat area there is also considerable anatomical variation per individual patient. Generally, the prior known neck and throat coils are hard objects which conform to the anatomic shapes of the target area. Due to the individual differences between patients, however, the inside coil dimensions must be made according to the largest patients, resulting in a poorer picture quality on smaller patients for whom such a coil is too large. The coils can be produced in a plurality of sizes but this increases the price of the apparatus.

In head imaging, the head is conventionally set on a special head rest, which takes care of a proper head position during the course of imaging and whose purpose is also to maintain the head stationary. The head rests are generally trough-like hard objects. Supporting or bracing is generally effected by using separate or head-rest mounted support pieces, which may come in various shapes and sizes and which are generally soft. Positioning and finding the proper pieces takes time and a support suitable for each patient is not necessarily found. Sometimes the head is also braced by using a belt which is tied over the head.

SUMMARY

An object of this invention is to provide an arrangement, whereby the above drawbacks associated with supporting a coil and a patient can be eliminated by means of a support shapeable according to individual anatomy.

The support comprises a cushion, having air pumped therein for reaching a desired cushion thickness. The cushion can be placed inside a soft and yielding coil or on the surface of an object intended for supporting the patient between the supporting object and the patient or between the supporting object and the coil. There may be one or a plurality of cushions. By pumping a desired amount of air therein, the cushion can be brought to support a coil and a patient as desired so as to maintain the patient stationary all the time.

The back coil can be designed as a flat, soft and flexible object, the pumpable cushion being located underneath its winding layer. By pumping air into the cushion said coil can be pressed against the back surface so as to bring the winding layer to a location as close to a patient's skin as possible. Thus, the distance between winding and patient is made as small as possible especially within the lower back section. If it is not necessary, the cushion need not be pumped at all e.g. within the upper back section.

The pumpable cushion can be movable within a coil to account for a difference curvature of the back on different patients and at different times of setting. A drawback here is that, if the position of a cushion relative to a coil is to be displaced, the patient must be removed from top of the coil for such displacement. In order to avoid this, there may be a plurality of cushions within the coil in the longitudinal and/or lateral direction thereof in view of using just those cushions that are needed at any given time. The cushion can also be made movable.

The neck coil can also be designed as a soft and resilient coil, the pumpable cushion or cushions being located underneath its winding layer. The cushions can be used for pressing the coil against the throat and neck both from below and sideways.

The trough-like head rest can also be fitted with pumpable cushions, either one or more. These can be used for bracing the head of each individual patient in a stationary position by pumping air into the cushions to make them fill the space between head rest and patient.

BRIEF DESCRIPTION OF THE DRAWINGS

The invention will be further explained with the aid of the drawing in which:

FIG. 2 is a cross-sectional view of the anatomic support shown in FIG. 1;

FIG. 3 is an exploded perspective view of the anatomical support of the present invention suitable for use with apparatus for imaging the neck;

DETAILED DESCRIPTION

Figure 1:
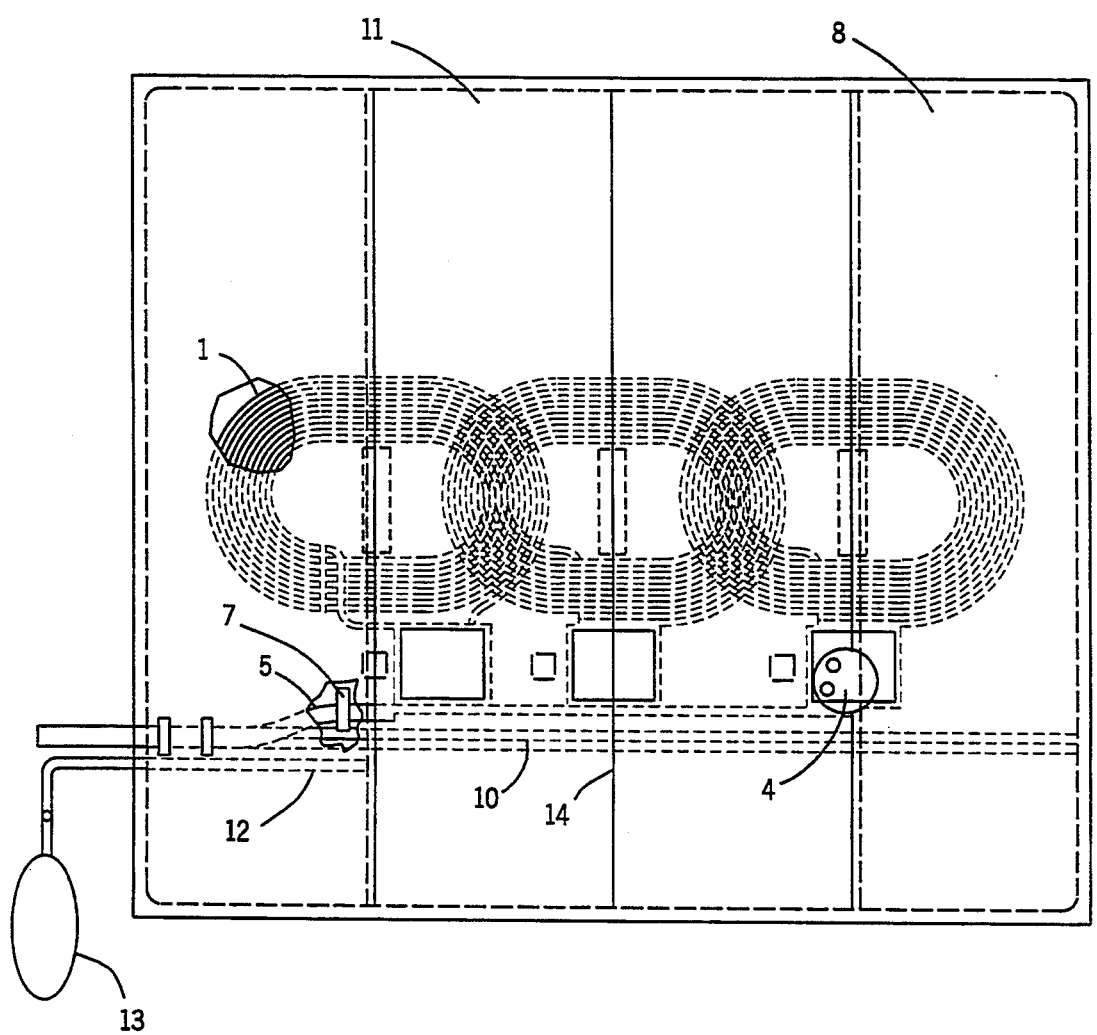
FIG. 1 is a plan view of the anatomical support of the present invention shown in conjunction with a back coil.

As shown in FIGS. 1 and 2, the RF-coil is wound of a flexible copper conductor 1 which can be litz wire, as in the present case, or copper foil. The winding wire 1 is placed in guide grooves, which are included in a flexible guide member 2 made of soft foamed plastics and which can be machined e.g. by water-cutting technique. The guide member is mounted e.g. by the application of an adhesive upon a flexible base member 3 made of foamed plastics. In this example, the coil winding consists of three separate lap windings.

The excitation circuits required for coil excitation are mounted on a card 4, which can also be flexible and a plurality of which can be included, if necessary. In addition to winding guides, the guide member 2 can be provided with installation recesses and slots for fitting the cards and necessary cables 5.

On top of the guide member is mounted e.g. by gluing, a protective plate 6, which is a thin flexible plastic sheet and the purpose of which is to protect components of the cards placed underneath the sheet as well as the winding wire against possible impacts on the coil surface. The cable is fastened to the protective plate e.g. by means of bundle presses 7, whereby the bending of a cable extending from the coil does not damage the coil.

Over the coil is fitted a protective bag 8, which can be made e.g. of imitation leather and whose inner surface can be provided with a laminated layer of foamed plastics 9 for attaining a sufficient softness. The protective bag can be made openable e.g. by means of a plastic zipper 10 fitted on the bottom. The protective bag is provided with a hole for a cable outlet e.g. at the zipper.

A pumpable cushion 11 can be made of rubber or plastics and it is fitted inside the protective bag underneath the coil. The cushion is provided with an inflation and deflation hose 12 which can project from inside the protective bag e.g. through the cable outlet. There can even be several such cushions inside the protective bag. A pump 13 can be e.g. a hand-operated pump ball provided with a deflation valve.

On top of the protective bag it is possible to mark desired alignment lines 14 to indicate the position of lap windings inside the bag for aligning a patient relative to the coil.

Air can also be pumped out of the bag after the alignment, whereby the bag and a flexible coil contained therein stiffen to retain the same shape as that prior to deflation, i.e. the coil will be shaped as desired relative to an object, for example, a flexible coil will be shaped tightly according to the cervical column of a patient.

FIG. 3 shows a supporting cushion suitable for use with an RF-coil for imaging the neck of a patient. Elements corresponding to those in FIGS. 1 and 2 have been identified with similar reference numerals.

Figure 4:
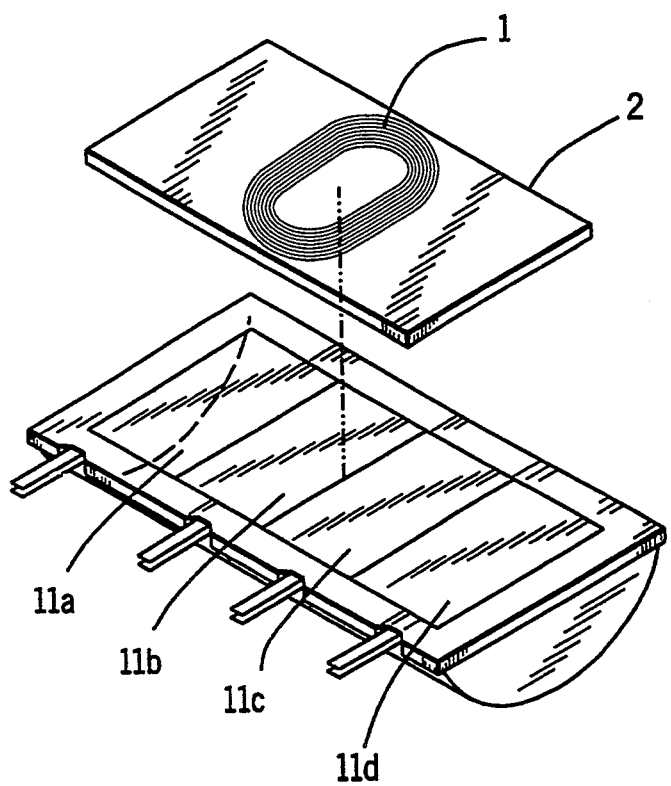
FIG. 4 shows a modification of the support shown in FIG. 3 and having a plurality of pumpable cushions.

FIG. 4 shows a modification of the apparatus shown in FIGS. 1 through 3 incorporating a plurality of pumpable supporting cushions 11a, 11b, 11c, and 11d.

Figure 5:
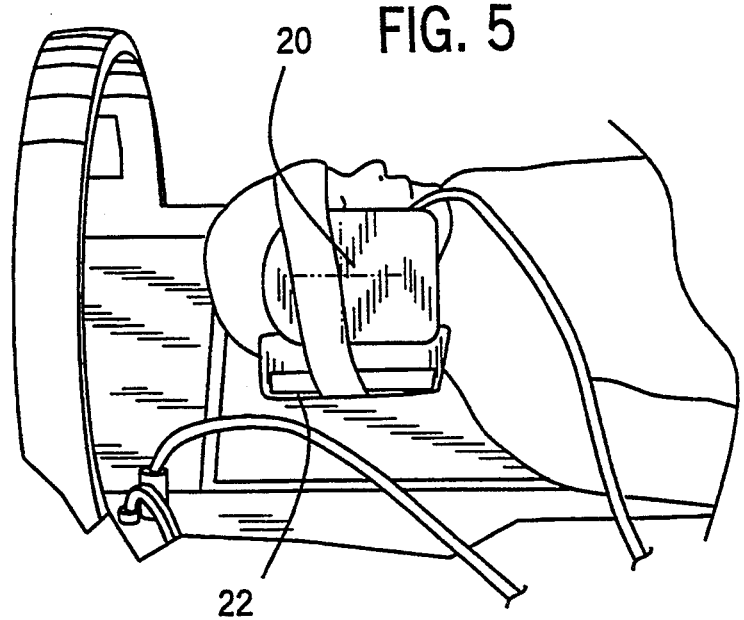
FIG. 5 shows an embodiment of the invention providing patient restraint and used in conjunction with a head bracing cushion.

As shown in FIG. 5, the supporting cushion 20 may be fitted between an object, such as head rest 22, and the patient for bracing the patient's head in the rest when the cushion is inflated.

I claim:

1. A support for supporting a desired portion of the body of a patient undergoing examination in a magnetic resonance imaging apparatus, said support comprising:
   a flexible RF-imaging coil device having a surface, said surface adapted to be placed in contiguity with the desired portion of the patient's body; and
   at least one cushion mounted in operative association with said flexible RF-imaging coil device at a location other than said surface, said cushion having at least one chamber to which air may be applied or from which air may be evacuated to inflate or to deflate said cushion, the inflation or deflation of said cushion rendering the surface of the RF-imaging coil device contiguous with the desired portion of the patient's body.

2. A support as set forth in claim 1 wherein said flexible RF-imaging coil device has a further surface opposite the surface that is contiguous with the desired portion of the patient's body and wherein said cushion is mounted in operative association with said further surface.

3. A support as set forth in claim 1 wherein said surface has a pair of opposing sides defining said surface and wherein said cushion is operatively associated with said sides.

4. A support as set forth in claim 1 wherein said cushion is fixedly mounted on said flexible RF-imaging coil device.

5. A support as set forth in claim 1 wherein said cushion is removably mounted on said RF-imaging coil device.

6. A support as set forth in claim 1 wherein said cushion is movably mounted on said flexible RF-imaging coil device.

7. A support as set forth in claim 1 wherein said cushion includes a plurality of inflatable and deflatable chambers.

* * * * *